(12) United States Patent

Ko et al.

(10) Patent No.: US 6,537,911 B2
(45) Date of Patent: Mar. 25, 2003

(54) CHEMICAL VAPOR DEPOSITION METHOD

(75) Inventors: Sang-Tae Ko, Seoul (KR); Katsuhisa Yuda, Tokyo (JP)

(73) Assignees: Anelva Corporation, Tokyo (JP); NEC Corporation, Tokyo (JP)

( * ) Notice: Subject to any disclaimer, the term of this patent is extended or adjusted under 35 U.S.C. 154(b) by 0 days.

(21) Appl. No.: 10/073,228

(22) Filed: Feb. 13, 2002

(65) Prior Publication Data

US 2002/0110998 A1 Aug. 15, 2002

(30) Foreign Application Priority Data

Feb. 15, 2001 (JP) ....................................... 2001-038631

(51) Int. Cl.$^7$ .............................................. H01L 21/44
(52) U.S. Cl. ....................................... 438/680; 438/770
(58) Field of Search ................................. 438/685, 656, 438/680, 770; 427/248.1, 579; 118/723

(56) References Cited

U.S. PATENT DOCUMENTS 5,976,308 A * 11/1999 Fairbairn et al. ............ 118/715
6,063,441 A * 5/2000 Koai et al. ................ 427/248.1
6,125,859 A * 10/2000 Kao et al. ..................... 134/1.1
6,151,071 A * 11/2000 Petilli ......................... 348/312
6,364,995 B1 * 4/2002 Fairbairn et al. ......... 118/723 I

* cited by examiner

Primary Examiner—Phat X. Cao
Assistant Examiner—Thao X. Le
(74) Attorney, Agent, or Firm—Wenderoth, Lind & Ponack, L.L.P.

(57) ABSTRACT

In a CVD method using a CVD system in which the inside of the vacuum container of the said CVD system is separated into a plasma generating space and a film forming space by a conductive partition wall having plural penetration holes, exciting radicals produced in the plasma generating space are introduced into the film forming space only through the said penetration holes, supplying material gas from outside into an inner space of the said partition wall, which is separated from the plasma generating space and communicating with the film forming space through plural diffusion holes, and introducing the said material gas into the film forming space through the said diffusion holes, and a film is formed on the substrate by the exciting radicals and material gas thus introduced into the film forming space, the invention is intended to provide a CVD method suited to mass production of oxide films, mainly to mass production of oxide films for gate having excellent characteristics. The object is achieved by adopting the process comprising a first step of forming a film on the substrate as the before described, and a second step of emitting exciting radicals to the film formed at the first step to promote oxidation reaction.

2 Claims, 4 Drawing Sheets (a)

(b)

(c)

CHEMICAL VAPOR DEPOSITION METHOD

BACKGROUND OF THE INVENTION

1. Field of the Invention

The present invention relates to a Chemical Vapor Deposition (hereinafter referred to as CVD) method. More particularly, the present invention relates to a CVD method suited to mass production of oxide films having favorable characteristics, especially suited to mass production of oxide films for gate and having favorable characteristics.

2. Description of the Related Art

As a manufacturing method of liquid crystal display, a method of using high temperature polysilicon TFT (thin film transistor) and a method of using low temperature polysilicon TFT have been known. In the manufacturing method of using high temperature polysilicon TFT, in order to obtain a silicon oxide film of high quality, a quartz substrate which can be fit for a high temperature exceeding 1000° C. is used. By contrast, in manufacture of low temperature polysilicon TFT, an ordinary glass substrate for TFT is used, so that it is necessary to form a film at low temperature (for example, 400° C.). The manufacturing method of liquid crystal display by using low temperature polysilicon TFT has an advantage that its manufacturing cost is small, since it dose not require any special substrate. So that, it is hence widely employed recently, and its production is expanding.

In manufacturing of liquid crystal display by using low temperature polysilicon TFT, and forming a silicon oxide film appropriate as gate insulating film at low temperature, plasma enhanced CVD is used.

When forming a silicon oxide film by the plasma enhanced CVD, silane or tetraethoxy silane (TEOS), etc. are used as representative material gas. The material gas is generally used in a state of adding carrier gas such as helium (He), etc., and hereinafter it is merely referred to as the material gas.

When forming a silicon oxide film by plasma enhanced CVD, using silane or the like as material gas, in a conventional plasma enhanced CVD system, the material gas and oxygen are introduced in the front space of the substrate, and then, plasma is produced by mixed gas of material gas and oxygen, and the substrate is exposed to the plasma, thereby a silicon oxide film is formed on the surface of the substrate. In such a conventional plasma enhanced CVD system, the material gas is directly supplied into the plasma produced in the plasma enhanced CVD system. Accordingly, in the conventional plasma enhanced CVD system, ions of high energy are injected from the plasma exiting in the front space of the substrate to the film forming surface of the substrate, and the silicon oxide film is damaged, so that, film propertied are impaired. Further, since the material gas is directly introduced into the plasma, the material gas and plasma react violently with each other to generate particles, thereby lowering the yield.

To solve the problems, in the previous Japanese Patent Application (unexamined Japanese Patent Publication No. JP P2000-345349A), it has been attempted to improve the conventional plasma enhanced CVD system, and a new CVAD system was proposed.

The CVD system proposed in JP P2000-345349A is a system for producing plasma in vacuum container to generate neutral exciting radicals, that is to say to generate exciting radicals, and forming a film on the substrate by the said exciting radicals and materials gas. A conductive partition wall is disposed in the inside of the vacuum container of the said CVD system. Thereby, the inside of the vacuum container is separated by the conductive partition wall into two compartments. One of these two compartments is formed as a plasma generating space containing high frequency electrode, and the other is formed as a film forming space with a substrate holding mechanism for mounting substrate. The conductive partition wall has plural penetration holes for communicating between the plasma generating space and film forming space, and also has an inner space separated from the plasma generating space and communicating with the film forming space through plural diffusion holes.

In a CVD method conducted by a CVD system proposed in JP P2000-345349A, the material gas is supplied from outside into the inner space of the conductive partition wall, and is introduced into the film forming space through the plural diffusion holes. On the other hand, exciting radicals formed in the plasma generating space are introduced into the film forming space only through the plural penetration holes opened in the conductive partition wall. And, in the film forming space, a film is formed on the substrate by the exciting radicals and materials gas introduced into the film forming space as the before described.

In the CVD system proposed in this JP P2000-345349A, concerning the size (length and diameter) and structure of the penetration holes and diffusion holes, the penetration holes are defined in the size length and diameter) and structure so that the material gas introduced in the film forming space may not diffuse reversely into the plasma generating space, and the diffusion holes are defined in the size (length and diameter) and structure so that the exciting radicals introduced in the film forming space may not diffuse reversely into the inner space of the conductive partition wall.

That is, in the CVD system proposed in JP P2000-345349A, the condition of uL/D>1 is satisfied, where u is the gas flow velocity in penetration holes, L is the substantial length of penetration holes (see FIG. 3, in this case, L is the length of the portion of the minimum diameter), and D is the binary diffusivity (mutual gas diffusion coefficient of two types of gases of material gas and process gas, for example, silane gas and oxygen gas). Concerning with the diffusion holes, too, the same condition as in the penetration holes is applied.

By the CVD system proposed in JP P2000-345349A, worsening of film properties of silicon oxide film formed on the glass substrate can be prevented, and the product yield can be improved.

Generally, silicon oxide film formed on a substrate by using exciting radicals, which are produced by generating plasma in a vacuum container, and material gas contains OH, hydrogen atom, or excessive silicon in the thin film (silicon oxide film) or in the lower interface of the thin film (silicon oxide film). The said OH, hydrogen atom, etc. may deteriorate the characteristics of silicon oxide film, which are required as insulating film. For example, the said deterioration of characteristics may include any increase of leak current, and hysteresis in capacitance-voltage curve.

SUMMARY OF THE INVENTION

It is hence an object of the present invention in manufacture of large-sized liquid crystal display using low temperature polysilicon TFT, to provide a CVD method capable of improving the film properties by using the CVD system newly proposed in JP P2000-345349A, which has successively prevented reverse diffusion of material gas into the plasma forming region, in the case of forming silicon oxide film on a substrate of a large area by using material gas such as silane, on the basis of the CVD making use of plasma.

To achieve the object, the present invention provides the following CVD method.

That is, the CVD method according to an aspect of the present invention is a CVD method for generating plasma in a vacuum container to produce exciting radicals, and forming a film on a substrate by the said exciting radicals and material gas. The CVD system to which this method is applied is composed as follows. That is, the inside of the vacuum container of the CVD system is separated into two compartments by a conductive partition wall, and one of the two separated compartments is formed as a plasma generating space containing a high frequency electrode, and the other compartment is formed as a film forming space containing a substrate holding mechanism for mounting substrates. The conductive partition wall has plural penetration holes for communicating between the plasma generating space and film forming space. And the conductive partition wall also has an inner space separated from the plasma generating space and communicating with the film forming space through plural diffusion holes.

In the CVD method conducted by the CVD system newly proposed in JP P2000-345349A as the before described, the material gas supplied from outside into the inner space of the conductive partition wall is introduced into the film forming space through the plural diffusion holes, and a high frequency electric power is applied to the high frequency electrode to generate a plasma discharge thereby generating exciting radicals in the plasma generating space, and the exciting radicals generated in the plasma generating space are introduced into the film forming space through the plural penetration holes in the conductive partition wall, and a film is formed on the substrate by the introduced exciting radicals and material gas in the film forming space.

The CVD method of the present invention conducted by the CVD system newly proposed in JP P2000-345349A as the before described, is characterized that it comprises a first step of forming a film on the substrate by the exciting radicals and material gas introduced in the film forming space, and a second step of cutting off the material gas supplied from outside into the inner space of the conductive partition wall to zero flow rate, and emitting the exciting radicals introduced in the film forming space through the plural penetration holes of the conductive partition wall to the thin film formed at the first step.

The CVD system having the above configuration to which the CVD method proposed by the present invention is applied is newly proposed in JP P2000-345349A. In this CVD system, plasma is generated by using oxygen gas, and a thin film is deposited on the surface of a substrate by using material gas such as silane and exciting radicals generated by the plasma. And, the inner space of the vacuum container, which is used as the treating compartment, is separated by a conductive partition wall into a plasma generating space for generating plasma and a film forming space. So that the treating surface of the substrate disposed in the film forming space is not exposed to the plasma. Being separated by the conductive partition wall, moreover, the material gas introduced in the film forming space is sufficiently suppressed from moving to the plasma generating space side. That is, plural penetration holes are formed in the conductive partition wall, and the plasma generating space and the film forming space existing at both sides of the conductive partition wall communicate with each other only through the said penetration holes, but the penetration holes are defined in the size and structure for preventing the material gas introduced in the film forming space from diffusing reversely to the plasma generating space side.

The characteristic structure of the CVID system proposed in JP P2000-345349A as the before described can be used for cutting off introduction of material gas into the inner space of the conductive partition wall, which separating the inner space of the vacuum container into the plasma generating space and film forming space, and selectively emitting only the electrically neutral exciting radicals, produced by the oxygen plasma generated in the plasma generating space, to the glass substrate disposed in the film forming space. And the said characteristic structure is suited to realizing it easily.

Accordingly, the present invention is intending to sufficiently use the before described characteristic structure of the CVD system proposed in JP P2000-345349A as well as to remove OH, hydrogen atom, and excessive silicon existing in the thin film or in the lower interface of the thin film. If OH, hydrogen atom, excessive silicon, etc. are existing in the thin film or in the lower interface of the thin film, it is considered that the characteristics of silicon oxide film is deteriorated, although the least amount of contained OH, hydrogen atom, and excessive silicon is required for silicon oxide film when it is used as insulating film.

According to the present invention, at the second step, by emitting exciting radicals successively to the film, which has been formed on the substrate by the exciting radicals and material gas introduced in the film forming space during a first step, the oxidation reaction can be promoted sufficiently while avoiding the risk of impact of the high energy ions to the silicon oxide thin film from the plasma.

Thus, the above problems are solved by the CVID method of the present invention for completing the process comprising the before described first step and second step.

As clear from the explanation herein, in the CVD method for forming a silicon oxide film or the like by using material gas such as silane, etc. by the plasma CVD on a substrate of a large area, for example, in the CVD method using a CVD system in which the inside of a vacuum container of the said CVD system is separated into a plasma generating space and a film forming space by a conductive partition wall having plural penetration holes, exciting radicals produced in the plasma generating space are introduced into the film forming space only through the said penetration holes, supplying material gas from outside into an inner space of the said conductive partition wall, which is separated from the plasma generating space and communicating with the film forming space through plural diffusion holes, and introducing the said material gas into the film forming space through the said diffusion holes, thereby thin film is formed on the substrate by the exciting radicals and material gas thus introduced into the film forming space, according to the present invention, thin film having excellent characteristics may be mass produced, by adopting the process of the present invention comprising a first step of forming a film on the substrate as the before described, and a second step of emitting exciting radicals to the film formed at the first step to promote oxidation reaction.

For example, in the oxide film for gate manufactured by employing the CVD method of the present invention comprising the before described first step and second step, the maximum hysteresis (maximum value of voltage difference at voltage-up characteristics and voltage-down characteristics) in the capacitance-voltage curve is improved from 1.2 V to 0.3 V as compared with the process of omitting the second step of the invention, that is, omitting the step of emitting exciting radicals.

The CVD system to which the CVD method of the present invention is applied can convey the electrically neutral exciting radicals produced in the plasma generating space selectively into the film forming space as mentioned above. Therefore, it is a great merit that the silicon oxide film in the process of forming at the first step is not exposed to the plasma containing high energy particles. Moreover, structurally, the material gas can be introduced only into the space opposite to the glass substrate, that is only into the partition wall, so that it is easy to change over lead-in and cut-off of material gas, and it is easy to control the gas content in the vacuum container, and hence the emitting process of exciting radicals at the second step can be also carried out effectively. That is, the CVD method of the present invention can make the best of the features of the CVD system to which this method is applied.

DESCRIPTION OF THE PREFERRED EMBODIMENTS

Preferred embodiments of the present invention are described below while referring to the accompanying drawings.

Figure 1:
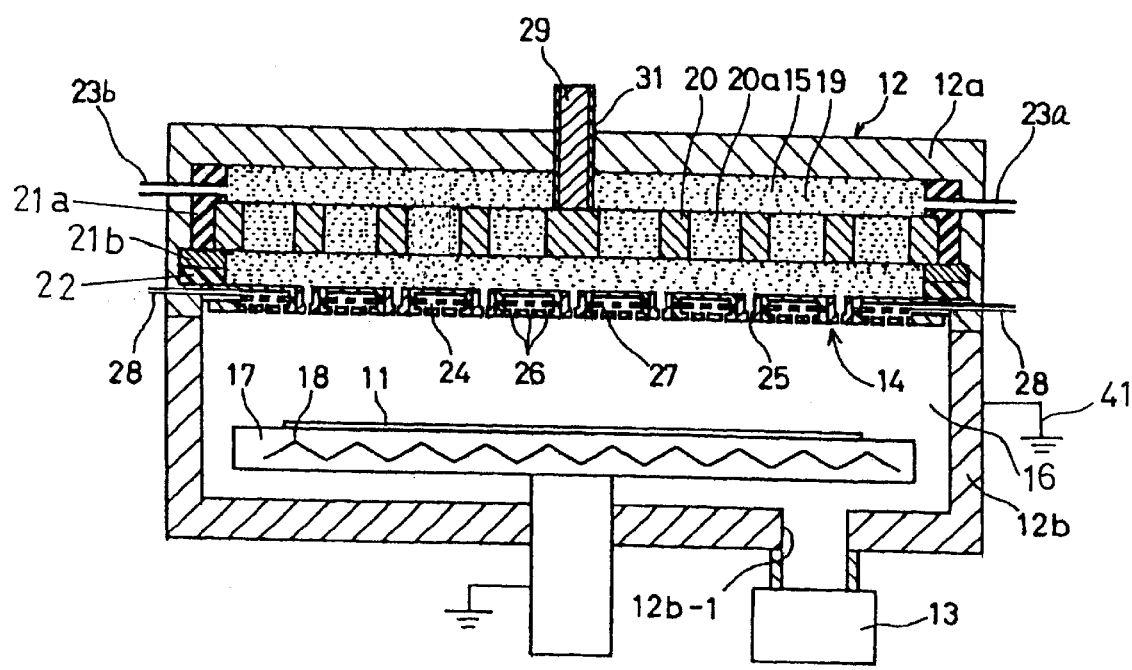
FIG. 1 is a longitudinal sectional view showing a first embodiment of a CVD system to which the CVD method of the present invention is applied.
Figure 2:
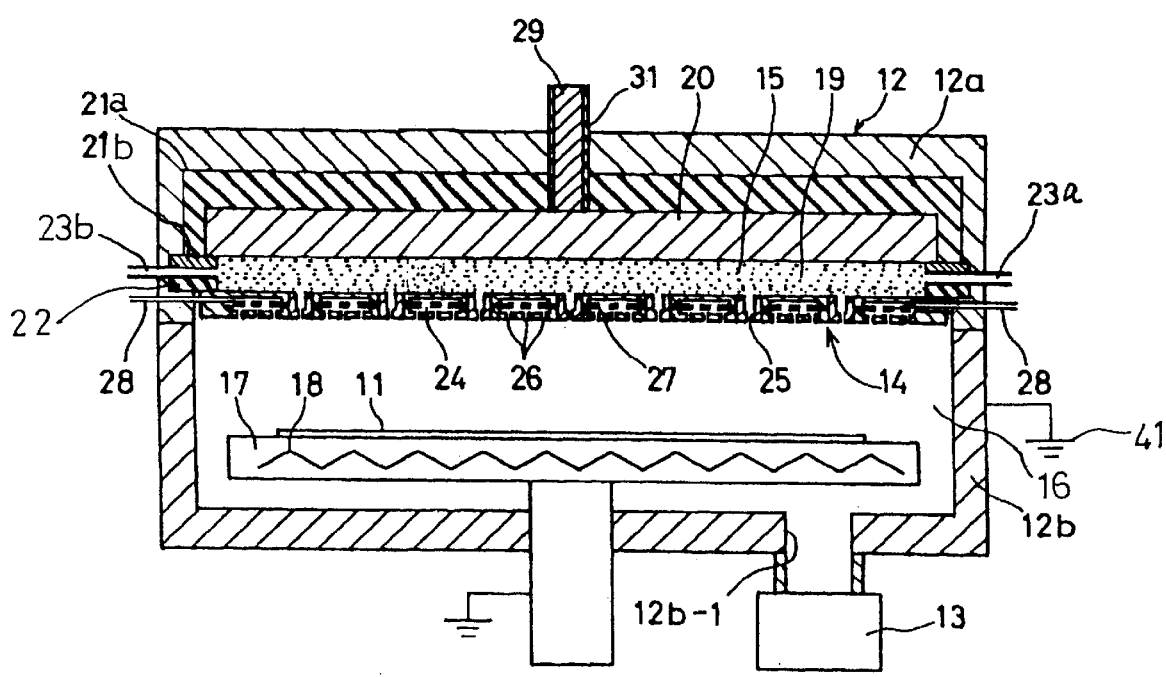
FIG. 2 is a longitudinal sectional view showing a second embodiment of a CVD system to which the CVD method of the present invention is applied.

Referring first to FIG. 1 and FIG. 2, embodiments of the CVD system to which the CVD method of the present invention is applied are explained. In FIG. 1 and FIG. 2, in this CVD system, silane is used as the material gas preferably, and a silicon oxide film is formed as a gate insulating film on the upper surface of an ordinary glass substrate 11 for TFT. A container 12 of the CVD system is a vacuum container for keeping its inside in a desired vacuum state by means of an exhaust mechanism 13 when forming a film. The exhaust mechanism 13 is connected to an exhaust port 12b-1 formed in the vacuum container 12.

Inside the vacuum container 12, a partition wall 14 formed of a conductive member is disposed in a horizontal state. The said conductive partition wall 14 having a rectangular shape, for example, in a plane shape is disposed to form an enclosed state with its peripheral edge being pressed to the lower side of a conductive fixing portion 22.

Thus, the inside of the vacuum container 12 is separated into two compartments, upper and lower, by the partition wall 14, and the upper compartment forms a plasma generating space 15, and the lower compartment forms a film forming space 16. The partition wall 14 has a specified thickness, and has a generally flat shape, and its plane shape is similar to the horizontal sectional shape of the vacuum container 12. An inner space 24 is formed in the partition wall 14.

The glass substrate 11 is disposed on a substrate holding mechanism 17 provided in the film forming space 16. The glass substrate 11 is substantially parallel to the partition wall 14, and is disposed so that the film forming surface (upper surface) may be opposite to the lower surface of the partition wall 14.

The potential of the substrate holding mechanism 17 is held at a grounding potential 41 which is the same as the potential of the vacuum container 12. Inside the substrate holding mechanism 17, a heater 18 is provided. By this heater 18, the temperature of the glass substrate 11 is held at a predetermined temperature.

The structure of the vacuum container 12 is more specifically explained. So as to be assembled easily, the vacuum container 12 is composed of an upper container 12a for forming the plasma generating space 15, and a lower container 12b for forming the film forming space 16. When composing the vacuum container 12 by combining the upper container 12a and lower container 12b, the partition wall 14 is provided at the position between the two. The conductive partition wall 14 is disposed so that its peripheral edge may contact with an electrically conductive member 22 which has the same potential as the vacuum container 12. As a result, the plasma generating space 15 and film forming space 16 separated between the upper side and lower side of the partition wall 14 are formed. By the partition wall 14 and upper container 12a, the plasma generating space 15 is formed.

In the first embodiment of the CVD system to which the CVD method of the present invention is applied, the region of generating plasma 19 in the plasma generating space 15 is composed of the partition wall 14, upper container 12a, and a flat electrode (high frequency electrode) 20 disposed nearly in the middle position between them. Plural holes 20a are formed in the electrode 20. The electrode 20 is supported and fixed by two insulating members 21a, 21b provided along the inner side of the upper container 12a.

In the ceiling of the upper container 12a, a power lead-in bar 29 connected to the electrode 20 is provided. By the power lead-in bar 29, high frequency power for discharge is supplied into the electrode 20. The electrode 20 functions as high frequency electrode. The power lead-in bar 29 is covered with an insulator 31, and is insulated from other metallic parts.

The conductive partition wall 14 is at the grounding potential 41 through an electrically conductive fixing portion 22.

A oxygen gas lead-in pipe 23a introducing oxygen gas for producing exciting radicals into the plasma generating space 15 from outside is provided through the insulating member 21a. Also, a cleaning gas lead-in pipe 23b for introducing cleaning gas such as fluoride gas used for cleaning after forming a specified film is provided through the insulating member 21a.

The inside of vacuum container 12 is separated into the plasma generating space 15 and film forming space 16 by means of the partition wall 14. The partition wall 14 has plural penetration holes 25 formed at dispersedly in a state of penetrating through the inner space 24. The size (length and diameter, etc.) and structure of penetration holes 25 are formed for preventing the material gas introduced in the film forming space 16 from diffusing reversely to the plasma generating space 15 side. That is to say, the condition of uL/D>1 is satisfied, where u is the gas flow velocity in penetration holes 25, L is the substantial length of penetration holes 25 (see FIG. 3, in this case, L is the length of the portion of the minimum diameter), and D is the binary diffusivity (mutual gas diffusion coefficient of two types of gases of material gas and process gas, in this case, silane gas and oxygen gas). And the plasma generating space 15 and film forming space 16 are communicated with each other only through these penetration holes 25.

Figure 3:
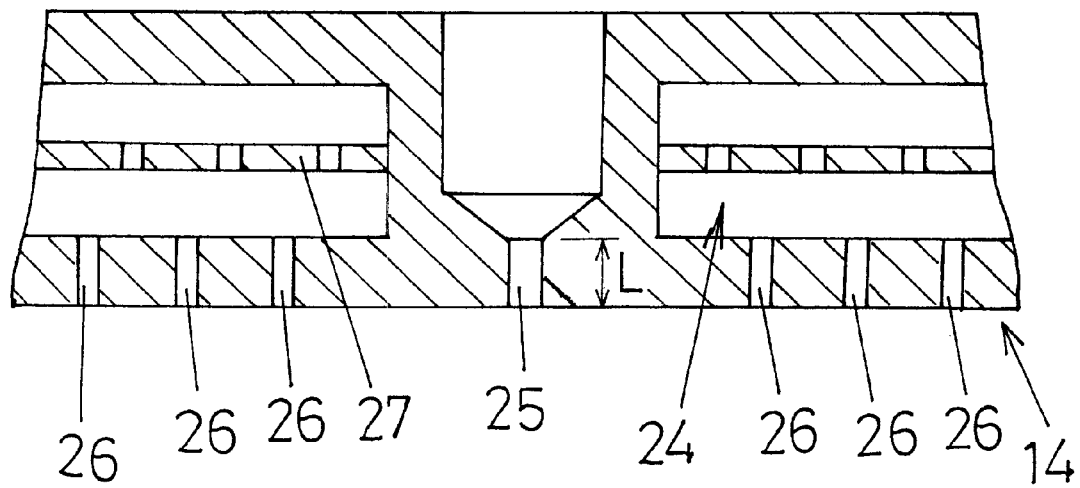
FIG. 3 is a schematic magnified view of an internal structure as seen from the sectional direction of the partition wall of the CVD system to which the CVD method of the present invention is applied.

FIG. 3 is a schematic magnified view of an internal structure as seen from the sectional direction of the partition wall 14 of the CVD system to which the CVD method of the present invention is applied. In FIG. 3, the upper side is the plasma generating space 15, and the lower side is the film forming space 16. The inner space 24 formed in the partition wall 14 is a space for dispersing the material gas introduced into the partition wall 14 from outside to supply uniformly into the film forming space 16. In a lower plate of the partition wall 14, plural diffusion holes 26 for supplying the material gas into the film forming space 16 are formed. The diffusion holes 26 satisfy the before described condition of uL/D>1.

A material gas lead-in pipe 28 for introducing material gas from outside is connected to the inner space 24 (FIG. 1, FIG. 2). The material gas lead-in pipe 28 is also connected to piping (not shown) for introducing carrier gas such as He (helium) gas. So that, the material gas is introduced together with the carrier gas into the inner space 24.

In the inner space 24, a pierced uniform plate 27 having plural holes for supplying the material gas from the diffusion holes 26 into the film forming space 16 uniformly is disposed almost horizontally (FIG. 3). The inner space 24 of the partition wall 14 is separated into upper and lower spaces by the uniform plate 27.

The material gas introduced into the inner space 24 of the partition wall 14 from the material gas lead-in pipe 28 is introduced into the upper space, passes through the holes of the uniform plate 27, reaches the lower space, and is further diffused into the film forming space 16 through the diffusion holes 26.

According to this structure, the material gas can be uniformly supplied into the whole capacity of the film forming space 16, but the internal structure of the partition wall 14 is not particularly limited to the structure explained above as far as the material gas can be supply uniformly into the entire film forming space 16.

In the below, the mechanism that the material gas does not diffuse reversly to the plasma generation space 15 is explained.

When a film is formed by using the before described CVD system, the glass substrate 11 is transferred into the vacuum container 12 by means of a transfer robot (not shown in the drawings) and is disposed on the substrate holding mechanism 17. The inside of the vacuum container 12 is evacuated by means of the exhaust mechanism 13 and the pressure is reduced and maintained at a predetermined vacuum state. Next, oxygen gas is fed through the oxygen gas lead-in pipe 23a into the plasma generating space 15 of the vacuum container 12.

The mass flow rate of the oxygen gas at this time is controlled by means of an external mass flow controller (not shown in the drawings).

On the other hand, material gas, for example, silane is led into an inner space 24 of the partition wall 14 through a material gas lead-in pipe 28, and led into the film forming space 16 through diffusion holes 26.

The flow velocity (u) of the oxygen can be obtained using the below described expressions (1) and (2), based on oxygen mass flow rate ($Qo_2$), pressure ($Po_2$), and temperature (T) of partition wall section:

$$Qo_2 = \rho o_2 uA \quad (1)$$

$$Po_2 = \rho o_2 RT/M \quad (2)$$

Where $\rho o_2$: Density of oxygen gas

M: Molecular weight of oxygen

R: Universal gas constant

T: Absolute temperature of the partition wall section

A: Total cross sectional area of the smallest diameter portion of the penetration holes 25 formed in the partition wall 14 u: Flow velocity of the oxygen gas flowing through the penetration holes 25

The relation uL/D>1 is derived as follows. For example, regarding the relation between the oxygen and the silane that are transferring through the penetration holes 25, an expression (3) shown below is established by using the silane gas density ($\rho_{SiH4}$), diffusion flow velocity ($u_{SiH4}$), and the binary diffusivity ($D_{SiH4-O_2}$). When the characteristic length of the penetration holes (the length of the portion of the minimum diameter) is represented by L, the expression (3) can be approximated by expression (4). As a result of a comparison between both sides of the expression (4), the diffusion flow velocity ($U_{SiH4}$) of the silane is expressed by $-D_{SiH4-O_2}/L$. Therefore, the oxygen flow velocity, as obtained from the above expressions (1) and (2), is represented by u, and the diffusion flow velocity of the silane is represented by $-D_{SiH4-O_2}/L$. The ratio between the absolute values of these two flow velocity values is the value of $|-u/(D_{SiH4-O_2}/L)| = uL/D_{SiH4-O_2}$, which represents the ratio between the flow velocity of oxygen and the diffusion velocity of silane. Setting the value of $uL/D_{SiH4-O_2}$ to exceed 1 means that the flow velocity of oxygen due to convection is greater than the diffusion velocity of silane. That is, the arrangement of the value of $uL/D_{SiH4-O_2}$ to exceed 1 means that the diffusion influence of silane is less, and the silane should not pass through the penetration holes 25.

$$\rho_{SiH4} U_{SiH4} = -D_{SiH4-O_2} \mathrm{grad} \rho_{SiH4} \quad (3)$$

$$\rho_{SiH4} U_{SiH4} \approx -D_{SiH4-O_2} \rho_{SiH4}/L \quad (4)$$

Next, a particular example is described below. The above expressions will produce a value of $uL/DsiH_4-o_2$ as equal to about 11 in the following case: the temperature in the partition wall 14 is 300° C., the smallest diameter of the penetration holes 25 formed in the partition wall 14 is 0.5 mm, the length (L) of a portion of the diameter 0.5 mm is 3 mm, the total number of penetration holes 25 is 500, the flow rate of oxygen gas is 500 sccm (=500 cm³/minute at the normal state), and the pressure in the film forming space 16 is 100 Pa. This indicates that, compared to the diffusion of the silane gas, since the flow influence is very large, the diffusion of the silane gas into the plasma generation space 15 is reduced.

FIG. 2 shows a second embodiment of the CVD system to which the CVD method of the present invention is applied. A characteristic feature of the embodiment shown in FIG. 2 is that the insulating member 21a is disposed at the inner side of the ceiling of the upper container 12a, and that the electrode 20 is disposed at its lower side. In the electrode 20, such hole 20a as in the first embodiment in FIG. 1 is not formed, but a single plate is formed. By the electrode 20 and partition wall 14, a plasma generating space 15 is formed by a parallel plate type electrode structure. The other configuration is substantially same as in the first embodiment in FIG. 1. In FIG. 2, substantially same elements as explained in FIG. 1 are identified with same reference numerals, and duplicate explanation is omitted. Further, the action and effect of the CVD system in the second embodiment are the same as in the first embodiment.

Using the CVD system having the before described configuration, film forming process (the first step) of the CVD method of the present invention is conducted as follows.

By a conveying robot not shown, a glass substrate 11 is carried into a vacuum container 12, and is put on a substrate holding mechanism 17. The inside of the vacuum container 12 is evacuated by an exhausting mechanism 13, and is reduced and held in a specific vacuum state. Through an oxygen gas lead-in pipe 23a, oxygen gas is guided into the plasma generating space 15 of the vacuum container 12.

On the other hand, material gas, for example, silane is led into an inner space 24 of the partition wall 14 through a material gas lead-in pipe 28. The silane is first introduced into the upper side of the inner space 24, mixed uniformly through a uniform plate 27b, moved to the lower side, and led into the film forming space 16 through diffusion holes 26 directly without contacting with the plasma. The substrate holding mechanism 17 provided in the film forming space 16 is heated by a heater 18 to be held at a specified temperature preliminarily.

In this state, a high frequency power is supplied to the electrode 20 through a power lead-in bar 29. Discharge is caused by this high frequency power, and an oxygen plasma 19 is formed around the electrode 20 in the plasma generating space 15. As the oxygen plasma 19 is generated, neutral radicals, that is to say exciting radicals, are generated, and they are introduced into the film forming space 16 through the penetration holes 25, while the material gas is introduced into the film forming space 16 through the inner space 24 and diffusion holes 26 of the partition wall 14. As a result, the radicals and the material gas come into contact with each other for the first time in the film forming space 16, and chemical reaction is induced, and a silicon oxide is deposited on the surface of the glass substrate 11, thereby forming a thin film.

The CVD method of the present invention is further described below while referring to the time charts in FIGS. 4(a), (b), and (c).

Up to time To, delivery of glass substrate 11 into the vacuum container 12 and installation on the substrate holding mechanism 17 are complete, an oxygen plasma is generated in the plasma generating space 15 in time ti ($T_1$-$T_0$), and introduction of silane into the inner space 24 of the partition wall 14 is started at time Ti.

Figure 4:
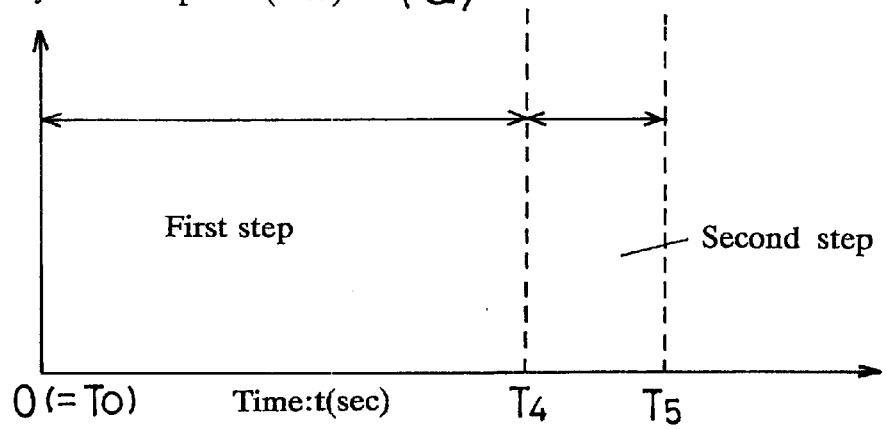
FIG. 4 is a time chart of the CVD method of the present invention, in which (a) is a time chart showing the relation between high frequency electric power and process time, (b) is a time chart showing the relation of oxygen feed amount and process time, and (c) is a time chart showing the relation of silane feed amount and process time.
Figure 4:
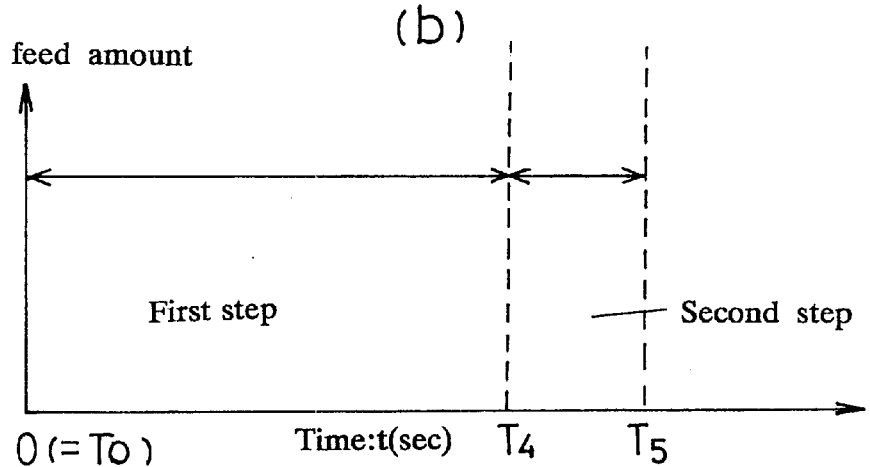
Figure 4:
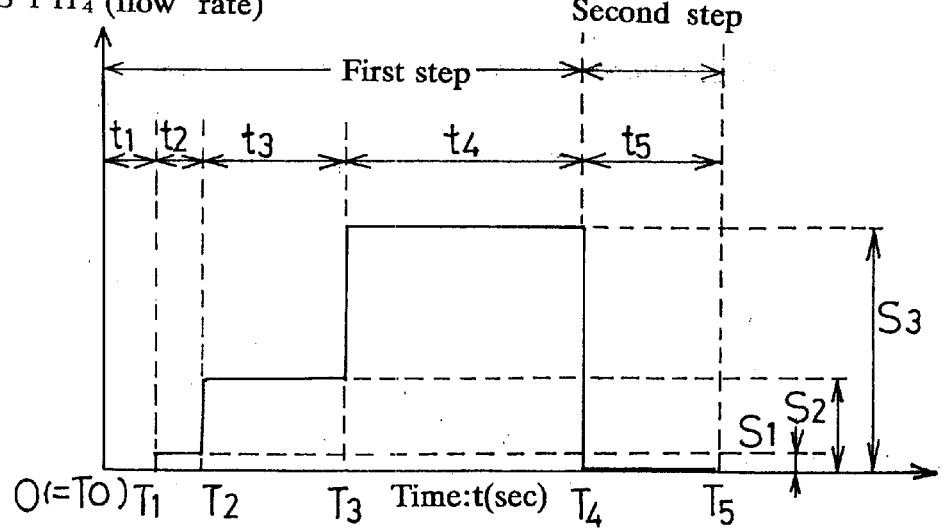

In FIG. 4(c), as an example of method of feeding silane as material gas, the flow rate of material gas (silane) is gradually increased to $S_1$, $S_2$, $S_3$ at time $T_1$, $T_2$, $T_3$, respectively. Alternatively, the flow rate of material gas (silane) may be increased monotonously, or material gas (silane) may be introduced at a constant flow rate.

While maintaining a maximum flow rate 83 from time $T_3$ to $T_4$, a film is formed during time $t_4$. Herein, the film forming step in duration ($T_4$-$T_0$) in FIG. 4(c) corresponds to the first step in the CVD method of the present invention.

In wan example of the first step below, a silicon oxide film in a film thickness of 1000 angstroms is formed on a glass substrate 11 measuring 370 mm×470 mm.

The vacuum container 12 is evacuated to 32 Pa, and oxygen gas is introduced from the oxygen gas lead-in pipe 23a in to the plasma generating space 15 of the vacuum container 12 at a flow rate of 1.7 g/min (1.2 SLM, Standard Liters/Minute) as shown in FIG. 4(b).

At this time, as shown in FIG. 4(c), the flow rate of silane as material gas is gradually increased from 0 mg/min to maximum of 29 mg/min (0.02 SLM), and is held at 29 mg/min. The flow rate of He gas, which is carrier gas of silane, is 36 mg/min (0.2 SLM).

A high frequency electric power is applied, as shown in FIG. 4(a), to the electrode 20 through the power lead-in bar 29 in the condition of 60 MHz and 1.2 KW, while the substrate holding mechanism 17 installed in the film forming space 16 is heated by the heater 18 and the glass substrate 11 is preliminarily held at 310° C.

In this film forming condition, a film was formed in a predetermined thickness in 6 minutes.

In FIG. 4(c), the process in the state of zero flow rate of material gas during time $T_4$-$T_5$ corresponds to the second step in the CVD method of the present invention.

At the second step, a high frequency electric power is applied to the electrode 20 of the plasma generating space 15 same as at the first step, and only the generated neutral radicals, that is, exciting radicals are fed into the film forming space 16 through penetration holes 25 in the partition wall 14, and only the exciting radicals introduced in the film forming space 16 are emitted to the thin films formed at the first step on the glass substrate 11 on the substrate holding mechanism 17. Accordingly, if OH or hydrogen atom is left in the thin film or in the lower interface of the thin film at the end of the first step or if an excessive silicon is present in the thin film, the oxidation reaction can be promoted sufficiently. As the result, these residual OH, hydrogen atom and excessive silicon, etc. are also oxidized, and the final oxide of silicon, that is, $SiO_2$ satisfying the stoichiometry is obtained, and a thin film of an excellent film property is formed.

As mentioned above, since the conductive partition wall 14 is securely contacting with the metal surface of the grounding potential 41, there is no leak of high frequency into the film forming space 16 at all. And the glass substrate 11 is not exposed to the plasma containing ions of high energy, and therefore only the exciting radicals, that is, electrically neutral radicals produced by the oxygen plasma in the plasma generating space 15 can be selectively emitted to the thin film formed at the first step.

In the embodiment shown in FIGS. 4(a), (b), and (c), the high frequency electric power applied to the electrode 20 and oxygen feed amount into the plasma generating space 15 at the second step are respectively the same as the high frequency electric power and oxygen feed amount at the first step, and the temperature of the glass substrate 11 is also the same at the first step and second step. However, the action and effect of the invention are not changed if the high frequency electric power (FIG. 4(a)), oxygen feed amount (FIG. 4(b)), and temperature of glass substrate 11 (not shown) at the second step are larger or smaller than the corresponding values at the first step.

The process time of the second step in the CVD method of the present invention varies somewhat depending on the film forming conditions, such as thickness of the film at the end of the first step, or material gas feed amount relating to the film forming speed, but generally if the film forming speed at the first step is increased, an insufficient oxidation region may increase, and the process time of the second step depends on the process time of the first step, and when the process time of the first step is shorter, that is, when the film forming speed is increased, the second step requires a longer process time in inverse proportion.

With respect to the flow rate of material gas, in the before described embodiment, the flow rate of material gas is gradually increased as shown in FIG. 4(c) at the first step. Alternatively, the flow rate of material gas can be increased monotonously, although it is not shown in the attached drawings, at the first step. Also, in the before described embodiment, the flow rate of material gas is gradually increased from 0 mg/min to 29 mg/min at the first step aiming to minimize the density of excessive silicon in the lower interface of the silicon film, that is to minimize the required process time of the second step. In either case, increasing the flow rate of material gas gradually or monotonously, it is preferable that the flow rate of material gas is to be 36 mg/min or less at maximum in actual production. The material gas lead-in method (number of times of increase of flow rate, flow rate, or lead-in time) may be determined arbitrarily so far as not exceeding the before described maximum flow rate.

The action of exciting radicals produced from the oxygen plasma on the silicon oxide film at the second step of the embodiment of the present invention is the same as the action of exciting radicals produced from the nitrogen plasma on the silicon nitride film, and the action of the exciting radicals produced from the fluorine plasma on the silicon fluoride film, in the aspect of promoting chemical reaction. Therefore, the CVD method of the present invention characterized by comprising the before described first step and second step can be similarly applied to forming of silicon nitride film or silicon fluoride film.

Preferred embodiments of the invention are explained as the before described by referring to the accompanying drawings, but the invention is not limited to these embodiments alone. And it can be changed and modified in various forms within the technical scope as understood from the claims given below.

What is claimed is:

1. A CVD method using a CVD system and generating plasma in a vacuum container of the CVD system to produce exciting radicals, and forming a film on a substrate by the exciting radicals and material gas, in which the inside of the vacuum container of the CVD system is separated into two compartments by a conductive partition wall, and one of the two separated compartments is formed as a plasma generating space containing a high frequency electrode, and the other compartment is formed as a film forming space containing a substrate holding mechanism for mounting substrates, the conductive partition wall has plural penetration holes for communicating between said plasma generating space and film forming space, and the conductive partition wall also has an inner space separated from the plasma generating space and communicating with the film forming space through plural diffusion holes; wherein, the material gas supplied from outside into the inner space of the conductive partition wall is introduced into the film forming space through the plural diffusion holes, a high frequency electric power is applied to the high frequency electrode to generate a plasma discharge in the plasma generating space, and the exciting radicals generated in the plasma generating space are introduced into the film forming space through the plural penetration holes in the conductive partition wall, and a film is formed on the substrate in the film forming space by the introduced exciting radicals and material gas;

characterized in that said CVD method comprises a first step of forming a film on the substrate by the exciting radicals and material gas introduced in the film forming space, and a second step of cutting off the material gas supplied from outside into the inner space of the conductive partition wall to zero flow rate and emitting the exciting radicals introduced in the film forming space through the plural penetration holes to the thin film formed at the first step.

2. The CVD method of claim 1, wherein the plural penetration holes are formed to satisfy a condition of uL/D>1, where u is the gas flow velocity in the penetration holes, L is the substantial length of the penetration holes, and D is the mutual gas diffusion coefficient.

* * * * *